(12) United States Patent
Ramalho Ferreira et al.

(10) Patent No.: US 12,105,111 B2
(45) Date of Patent: Oct. 1, 2024

(54) METHOD AND SYSTEM FOR DETERMINING EXISTENCE OF MAGNETIC DISTURBANCES

(71) Applicant: SWORD HEALTH S.A., Oporto (PT)

(72) Inventors: Marta Maria Ramalho Ferreira, Oporto (PT); Pedro Henrique Oliveira Santos, Oporto (PT); Luís Ungaro Pinto Coelho, Oporto (PT); Ana Clara Ferreira Matos, Oporto (PT); Virgílio António Ferro Bento, Oporto (PT)

(73) Assignee: SWORD HEALTH, S.A., Oporto (PT)

( * ) Notice: Subject to any disclaimer, the term of this patent is extended or adjusted under 35 U.S.C. 154(b) by 575 days.

(21) Appl. No.: 17/299,512

(22) PCT Filed: Dec. 5, 2019

(86) PCT No.: PCT/EP2019/083902
§ 371 (c)(1),
(2) Date: Jun. 3, 2021

(87) PCT Pub. No.: WO2020/115251
PCT Pub. Date: Jun. 11, 2020

(65) Prior Publication Data
US 2022/0003797 A1    Jan. 6, 2022

(30) Foreign Application Priority Data
Dec. 7, 2018  (EP) ..................... 18398011

(51) Int. Cl.
*G01P 13/00*    (2006.01)
*A63B 24/00*    (2006.01)
(Continued)

(52) U.S. Cl.
CPC .......... *G01P 13/00* (2013.01); *A63B 24/0003* (2013.01); *A63B 24/0062* (2013.01);
(Continued)

(58) Field of Classification Search
CPC . G01P 13/00; A63B 24/0003; A63B 24/0062; A63B 2220/40; A63B 2220/803;
(Continued)

(56) References Cited

U.S. PATENT DOCUMENTS

| | | | |
|---|---|---|---|
| 2005/0125108 A1 | 6/2005 | Kwon et al. | |
| 2005/0183275 A1 | 8/2005 | Kwon et al. | |

(Continued)

FOREIGN PATENT DOCUMENTS

| | | |
|---|---|---|
| EP | 3620752 A1 | 3/2020 |
| EP | 3891468 A1 | 10/2021 |

(Continued)

OTHER PUBLICATIONS

International Search Report issued Feb. 14, 2020 re: Application No. PCT/EP2019/093902, pp. 1-3.

(Continued)

*Primary Examiner* — Jonathan M Dunlap
(74) *Attorney, Agent, or Firm* — SCHWEGMAN LUNDBERG & WOESSNER, P.A.

(57) ABSTRACT

A method for adjusting operation of a motion tracking system having a computing device and sensors, wherein each sensor includes a magnetometer, a gyroscope and an accelerometer, includes the following steps: receiving, the computing device, a magnetic field measurement from each of the sensors; digitally processing, the computing device, each of the magnetic field measurements in order to determine if a difference of intensities and/or inclinations of at least one pair of magnetic field measurements exceeds a threshold value, and/or if an x,y point with the differences of intensities and inclinations as coordinates thereof falls outside of a threshold area; and adjusting the operation of the (Continued)

motion tracking system if at least one difference exceeds the threshold value and/or the x,y point falls outside of the threshold area.

20 Claims, 4 Drawing Sheets

(51) Int. Cl.
  *G01C 17/38* (2006.01)
  *G01C 21/16* (2006.01)
  *G01R 33/00* (2006.01)
  *G01R 33/022* (2006.01)

(52) U.S. Cl.
  CPC ...... *G01C 21/1654* (2020.08); *A63B 2220/40* (2013.01); *A63B 2220/803* (2013.01); *A63B 2220/89* (2013.01); *G01C 17/38* (2013.01); *G01R 33/0035* (2013.01); *G01R 33/022* (2013.01)

(58) Field of Classification Search
  CPC .............. A63B 2220/89; G01C 21/1654; G01C 17/38; G01R 33/022; G01R 33/0035
  See application file for complete search history.

(56) References Cited

U.S. PATENT DOCUMENTS

| | | | |
|---|---|---|---|
| 2006/0156564 A1 | 7/2006 | Kwon et al. | |
| 2008/0077326 A1* | 3/2008 | Funk | G01S 19/49 701/500 |
| 2013/0320966 A1* | 12/2013 | Oliver | G01R 33/0035 324/202 |
| 2014/0278183 A1* | 9/2014 | Zheng | G01C 25/005 702/96 |
| 2016/0011022 A1* | 1/2016 | Zheng | G01D 18/00 702/94 |
| 2016/0334219 A1* | 11/2016 | Askarpour | G01C 21/20 |
| 2016/0370203 A1* | 12/2016 | Hallberg | G01C 25/005 |
| 2018/0020978 A1 | 1/2018 | Kaifosh et al. | |
| 2022/0026461 A1* | 1/2022 | Ungaro Pinto Coelho | G01P 15/18 |
| 2022/0215925 A1* | 7/2022 | Oliveira Santos | G16H 20/30 |

FOREIGN PATENT DOCUMENTS

| | | |
|---|---|---|
| JP | H08114454 A | 5/1996 |
| WO | 2019243438 A1 | 12/2019 |
| WO | WO-2020115251 A1 | 6/2020 |

OTHER PUBLICATIONS

Written Opinion issued Feb. 14, 2020 re: Application No. PCT/EP2019/093902, pp. 1-7.

"European Application Serial No. 19813856.2, Invitation pursuant to Article 94(3) and Rule 71(1) EPC mailed Sep. 21, 2023", 11 pgs.

Von Marcard Timo, "Sparse Inertial Poser: Automatic 3D Human Pose Estimation from Sparse IMUs", arxiv.org, Cornell University Library, 201 Olin Library Cornell University Ithaca, NY 14853, (Mar. 23, 2017), 12 pgs.

European Application Serial No. 19813856.2, Response to Communication pursuant to Rules 161(2) and 162 EPC filed Jan. 5, 2022, 11 pgs.

* cited by examiner

METHOD AND SYSTEM FOR DETERMINING EXISTENCE OF MAGNETIC DISTURBANCES

TECHNICAL FIELD

The present invention relates to the field of sensors. More specifically, the present invention relates to methods and systems for determining the existence of magnetic disturbances that influence the measurements of magnetic field sensors.

STATE OF THE ART

Sensors are ubiquitous devices that contribute to the automatization of processes or tasks, irrespective of whether said processes or tasks are simple or complex, and they also contribute to the decision-making of people. Sensors have thus become a basic device in everyday life.

However, the automatization and decision-making may be negatively influenced when the measurements made by the sensors are not correct. A measurement is correct or not depending on the application and/or the apparatuses involved. In the technical field of motion tracking, the apparatuses for tracking motion of objects and/or people use different types of sensors. Some apparatuses use, inter alia, magnetometers for measuring magnetic fields; these sometimes are embodied as MARG sensors, i.e. magnetic, angular rate, and gravity sensors.

Magnetic disturbances are generally due to metallic and/or electronic elements or devices. Depending on the dimensions of the elements or devices, and/or the currents flowing therein while they are switched on, the magnetic field is distorted to a greater or lesser extent.

When a plurality of magnetic fields is to be sensed by a plurality of sensors, it is important that the magnetic fields measured by the sensors are either not severely affected by magnetic disturbances or similarly affected by magnetic disturbances, otherwise the motion of the object or person is tracked erroneously.

The ways in which the prior art attempts to determine the existence of magnetic disturbances mainly relies on establishing whether the dip and/or the norm of the sensed magnetic fields are/is not within the nominal ranges of values at different locations throughout the Earth. The nominal ranges of both inclination and intensity of the magnetic fields are generally broad. These nominal ranges can be retrieved by means of calculators, tables or maps provided with such information. In the prior art it is determined that there are magnetic disturbances when the dip and/or the norm deviate/s excessively from the range of expected values. Such approach is not convenient for many applications because: it is not accurate enough as significant magnetic disturbances may not be detected (if the deviation is not excessive, which is quite common; this happens when the sum of the Earth's magnetic field and the magnetic distortion does not fall outside of the broad nominal ranges), and it is not determined that each sensor of a plurality of sensors is affected by similar disturbances. In the case of MARG sensors, the lack of accuracy exists in spite of using the measurements of the gyroscope and/or the accelerometer for detecting and determining the existence of magnetic perturbances.

Accordingly, it would be advantageous to have a way to determine whether magnetic disturbances are affecting the measurements of the sensors. It would also be advantageous to have a way to operate devices or systems in accordance with the magnetic disturbances.

DESCRIPTION OF THE INVENTION

A first aspect of the invention refers to a method for adjusting operation of a motion tracking system comprising a computing device and a plurality of sensors, each sensor comprising a magnetometer, a gyroscope and an accelerometer, the method comprising:
  receiving, the computing device, a magnetic field measurement from each sensor of the plurality of sensors;
  digitally processing, the computing device, each of the magnetic field measurements in order to determine if a difference of intensities and/or inclinations of at least one pair of magnetic field measurements exceeds a threshold value, and/or if an (x,y) point with the differences of intensities and inclinations as coordinates thereof falls outside of a threshold area; and
  adjusting the operation of the motion tracking system if at least one difference exceeds the threshold value and/or the (x,y) point falls outside of the threshold area.

The sensors are proximate one to each other in order to be capable of tracking the motion of a target (e.g. a person, an object). At least during use, the sensors are normally spaced a few millimeters, centimeters and/or meters apart (between 1 mm and 10 m, and usually less than 2 m). Accordingly, the magnetometers of the sensors measure an almost exact same Earth's magnetic field, hence the differences between the magnetic field measurements are due to other phenomena that have a magnetic field associated therewith. Due to the variable orientations of the sensors on the tracked target, the computing device digitally processes measurements of the gyroscope and the accelerometer so as to determine the orientations of the sensors, and thus be capable of determining existence of one or more magnetic disturbances in spite of these variable orientations. The technique for determining the orientations of the sensors based on the measurements of the gyroscope and the accelerometer (and, optionally, further based on the measurements of the magnetometer) can be any one known in the art of person motion tracking or object motion tracking with sensors arranged on the tracked target and is not part of the scope of the present invention. In this respect, for the present invention it suffices that the computing device makes the determination of said orientations based on the aforementioned measurements.

The magnetic field measurements of the sensors are provided to the computing device, for example the sensors transmit the measurements to the computing device through a wired or wireless communications medium. The computing device processes the measurements in order to determine the existence of one or more magnetic disturbances that may result in an incorrect motion tracking; the level of the magnetic disturbances that make the motion tracking to be incorrect shall be greater or smaller depending on the application for which the motion tracking is conducted. Such level may be adjusted by modifying the threshold value, and/or the threshold range, each of which is stored in at least one memory of the computing device. The threshold value may be a predetermined threshold value that is, furthermore, adjustable in a memory of the computing device, for example it may be adjusted during operation of the motion tracking system. Similarly, the threshold area may be a predetermined threshold area that in some cases may be adjusted in the memory of the computing device during operation of the motion tracking system.

The computing device determines the existence of the magnetic disturbance(s) by comparing pairs of magnetic field measurements, particularly by comparing two different magnitudes of the measurements: the intensities of the measured magnetic fields, that is to say, the norm of the measured magnetic fields; and the inclinations of the measured magnetic fields, that is to say, the direction and sense of the measured magnetic fields. The difference between each pair of values is thereby computed, and the computing device determines the existence of the magnetic disturbance(s) by establishing whether any one of such differences exceeds a threshold value, and/or whether an (x,y) point falls outside of a threshold area, the (x,y) point having the difference of intensities or inclinations as X coordinate and the other one of the difference of intensities or inclinations as Y coordinate. The threshold area may be defined by a curve that establishes an area beyond which it is considered that the magnetic field measurement may be affected by magnetic disturbances, for example it may be the area under or above the curve, or the area surrounding the curve up to a predetermined distance from the curve. By way example, the curve defining the threshold area is provided by means of statistical modeling, such as by means of a regression algorithm whereby a regression curve is generated. In other examples, the curve defining the threshold area is provided by classification algorithms whereby a boundary is generated for classifying the differences.

It may occur that the intensities of two magnetic field measurements are similar and, thus, the difference thereof does not exceed the threshold value, but the inclinations of the same two magnetic field measurements are not similar and, thus, the difference thereof, that is to say the angle between the inclinations, exceeds the threshold value; or vice versa, the difference of intensities exceeds the threshold value but the difference of inclinations does not exceed the inclination threshold; or both differences exceed the threshold value(s) outside of the threshold area(s) (usually, different threshold values); or even that none of these differences exceed the threshold, but the (x,y) point formed with both differences falls outside of the threshold area. In any of these cases, the computing device determines that there is a magnetic disturbance that affects the measurements of at least one of the two sensors that have provided such magnetic field measurements by comparing the magnetic field measurement of this at least one sensor with the magnetic field measurements of another sensors, thus the computing device determines which sensor(s) is/are accurate relative to other sensors. In some examples, the computing device determines that both magnetic field measurements are incorrect.

When two magnetic field measurements are similarly affected by magnetic disturbances, the computing device may not determine the existence of the same because the differences between the two measurements is similar as if no magnetic disturbances had affected the measurements; accordingly, the magnetic field measurements may be valid for the motion tracking regardless of the magnetic disturbances. However, the computing device may determine the existence of the magnetic disturbances by comparing the magnetic field measurement of one (i.e. first sensor) of these two sensors (i.e. first and second sensors) with the magnetic field measurement of another sensor (i.e. third sensor) different from those two sensors: if the third sensor was affected differently by magnetic disturbances or not affected at all, the difference of intensities and/or the difference of inclinations resulting from said magnetic field measurements exceeds the threshold value, and/or the corresponding (x,y) point falls outside of the threshold area.

Since the motion tracking system is to be operated even when there are magnetic disturbances, the operation of the motion tracking system is adjusted so that during the motion tracking procedure (or another procedure associated with the motion tracking procedure) it is considered the existence of disturbances in the magnetic field measurements, and/or provides some indication that the motion tracking may not be correct. The computing device may adjust the operation of the motion tracking system or command another computing device that controls the motion tracking system to adjust the operation thereof.

In some embodiments, the step of digitally processing each of the magnetic field measurements comprises determining, for each pair of magnetic field measurements:
whether a difference of intensities of the magnetic field measurements exceeds an intensity threshold;
whether a difference of inclinations of the magnetic field measurements exceeds an inclination threshold; and
whether a weighted sum of the difference of intensities and the difference of inclinations exceeds a combined threshold;
and the operation of the motion tracking system is adjusted if at least one of the differences of intensities exceeds the intensity threshold, and/or at least one of the differences of inclinations exceeds the inclination threshold, and/or at least one of the weighted sums exceeds the combined threshold.

The computing device compares each difference with a corresponding threshold so as to determine if magnetic disturbance(s) has/have affected the magnetic field measurements. By way of example, the intensity threshold may be e.g. 2 µT (microtesla), 5 µT, 10 µT, etc., and the inclination threshold may be e.g. 5°, 7°, 10°, 15°, etc.

Also, the computing device computes the weighted sum of the differences (i.e. W1*diff_intensities+ W2*diff_inclinations) and compares it with a combined threshold that may not be (and in many embodiments is not) the sum of the intensity threshold and the inclination threshold. The parameters W1 and W2 are weighing factors set in the computing device; W1 and W2 may be fractional numbers that add up to less than 1 (e.g. W1=0.3 $\mu T^{-1}$; W2=0.5, etc.), that add up to 1, or that add up to more than 1 (e.g. W1=0.6; W2=2.0, etc.). These parameters are established such that both the difference of intensities and the difference of inclinations can be added together and, thus, compared with the combined threshold regardless of their units. To this end, the combined threshold is a dimensionless real value. When the difference of intensities and the difference of inclinations do not exceed respective thresholds, the weighted sum may exceed the combined threshold and, thus, the computing device determines that there is a magnetic disturbance affecting the magnetic field measurements.

Each of the intensity threshold, the inclination threshold and the combined threshold are predetermined thresholds stored in the memory of the computing device and which, furthermore, may be adjustable. For example, any one of these predetermined thresholds may be adjusted during operation of the motion tracking system.

In some cases, the sensors provide the magnetic field measurements already decomposed into intensity and inclination of the measured magnetic field, whereas in some other cases the computing device decomposes the magnetic field measurements into intensity and inclination of the measured magnetic field. The decomposition is performed as it is known in the art, for instance the intensity is the norm of the measured magnetic field, and the inclination is obtained by transforming the magnetic field vector into global coordinates and compute the angle with respect to the vector corresponding to the vertical, for example by applying a quaternion provided by the sensor fusion algorithm to the measurement. In some cases, the computing device digitally low-pass filters the intensity and the inclination of the magnetic field measurements prior to digitally process the magnetic field measurements in order to compute both the differences of intensities and the differences of inclinations. The computing device applies a digital low-pass filter to filter out noise in the intensity and inclination of the magnetic field sensed so that the digital processing is carried out on meaningful values of the measurements.

Preferably, the magnetic field measurements that the computing device receives correspond to measurements made by all the sensors at a same time instant or at a similar time instant, that is to say, the time delay between each pair of magnetic field measurements is as short as possible (preferably less than 1 second, and more preferably less than 100 ms, 10 ms, and/or 1 ms) so that the differences between the magnetic fields sensed are only or mostly due to magnetic disturbances. Usually, sensors of motion tracking systems measure the magnitudes with a high frequency, e.g. equal to greater than 25 Hz, 50 Hz, 100 Hz, or even at 1.0 or more kHz; accordingly, the computing device receives magnetic field measurements such that between two consecutive measurements of a same sensor, a time duration of 40 ms or less has elapsed, and thus it is possible to select from many measurements those that result in a shorter or shortest time delay between measurements of different sensors. In some examples, the computing device synchronizes the clocks of the sensors and/or commands the sensors to make the measurements at a particular time instant.

In some embodiments, the step of receiving, the computing device, a magnetic field measurement from each sensor of the plurality of sensors comprises:
  receiving, the computing device, a plurality of magnetic field measurements from each sensor of the plurality of sensors; and
  digitally selecting, the computing device, one magnetic field measurement from each plurality of magnetic field measurements provided by the sensors such that a time difference between each pair of selected magnetic field measurements is as short as possible.

In some embodiments, the step of adjusting the operation of the motion tracking system comprises (or further comprises) not processing the magnetic field measurements in a sensor fusion algorithm of respective sensors, the respective sensors being those for which the computing device has determined that the difference of the intensities and/or the inclinations exceeds the threshold value, and/or that the (x,y) point falls outside of the threshold area (for example, if it has determined that the difference of intensities exceeds the intensity threshold, and/or the difference of inclinations exceeds the inclination threshold, and/or the weighted sum exceeds the combined threshold).

The computing device or a computing device controlling the motion tracking system modifies the operation of the motion tracking system upon determining that there is a magnetic disturbance affecting the magnetic field measurements.

The sensors of the motion tracking system comprise a number of sensing devices that provide measurements related to the attitude and heading of the sensors themselves (which are related to the attitude and heading of a tracked target when the sensors are provided on the target). The sensors of the motion tracking system are preferably MARG sensors.

The sensors having a plurality of sensing devices generally include at least one processor and at least one memory with which they run a sensor fusion algorithm. As it is known in the art, the sensor fusion algorithm processes measurements from the sensing devices (e.g. magnetometers, gyroscopes, accelerometers, etc.) and outputs a processed measurement that in principle is more accurate than the raw measurements taken as inputs. The sensor fusion algorithm is thus intended to integrate all the measurements and remove the errors in the measurements that are due to the own nature and electronics of the sensing devices themselves.

The computing device or a computing device controlling the motion tracking system commands one or more sensors to disregard (or, alternatively, not input) its/their magnetic field measurements in the sensor fusion algorithm upon determining that the measurements are affected by magnetic disturbances. Such instruction is only provided to the sensor(s) for which it has been determined that the magnetometer thereof measures magnetic fields with magnetic disturbances. The sensor fusion algorithm does not process the magnetic field measurements and only processes the remaining measurements (at least those from the gyroscope and the accelerometer) in order to provide a measurement that is not affected by the magnetic disturbances.

When the method is repeated several times, when the computing device determines that further magnetic field measurements of the same sensor(s) are not affected by magnetic disturbances, the computing device commands said sensor(s) to use the magnetic field measurements in the sensor fusion algorithm once again. This is so because the magnetic disturbances are sometimes temporal, for instance due to the operation of an electronic device or because the limb of the tracked user where the sensor is located reaches a location with a magnetic disturbance while the tracked user performs a movement; therefore, the magnetic field measurements are disabled in the sensor fusion algorithm while the disturbances last. When such period of time is short, e.g. less than 2 minutes, less than 1 minute, less than 30 seconds, etc., the measurements of the gyroscope and the accelerometer are accurate enough and the measurements resulting from the sensor fusion algorithm are also more or less accurate in spite of not using the magnetic field measurements.

In some embodiments, the step of adjusting the operation of the motion tracking system comprises (or further comprises) digitally adjusting one of a motion tracking procedure or a physical exercise evaluation procedure.

The computing device or a computing device controlling the motion tracking system changes the way in which the motion tracking or the physical exercise evaluation is to be processed based on the sensors and the magnetic field measurements thereof for which the computing device has determined that the difference of the intensities and/or the inclinations exceeds the threshold value, and/or that the (x,y) point falls outside of the threshold area (for example, if it has determined that the difference of intensities exceeds the intensity threshold, and/or the difference of inclinations exceeds inclination threshold and/or the weighted sum exceeds the combined threshold). With regards to the former, the computing device attempts to make the motion tracking to be accurate enough despite the magnetic field measurements of one or more sensors are not correct. To this end, the computing device digitally modifies a motion of the tracked target such that it e.g. removes movements in one or more axes of one or more parts of the tracked target having a sensor thereon for which the computing device has determined that the difference of the intensities and/or the inclinations exceeds the threshold value, and/or that the (x,y) point falls outside of the threshold area. By way of example, the movements are removed based on a set of constraints defined by a model (stored in the computing device) that establishes how said one or more parts can move relative to other parts (with sensors thereon as well); if the computing device detects that the movements of the one or more parts relative to other parts do not match the model, it removes the movements in one or more axes so that it matches the model. For instance, if the motion tracking system tracks the motion of a bike, movements about the yaw axis may be removed by the computing device if there are magnetic disturbances affecting the measurements of sensors placed along the lengthwise axis of the bike that indicate that such movement is performed, but does not remove movements about the pitch and the roll axes since these are accepted by a model representing the movements of the bike.

The computing device may adjust the physical exercise evaluation procedures in which a number of constraints defining the physical exercise are established in the algorithms for evaluating the physical exercises. The computing device may deactivate one or more of these constraints in the algorithms so that the possible erroneously tracked parts of the physical exercise (that may result from the magnetic disturbances) are not taken into account in such evaluation procedures.

Usually, physical exercise evaluation procedures and, thus, algorithms base the physical exercise evaluation on the fulfillment of the different constraints, for example two, three, four or even more constraints, each of which defines a limitation of the physical exercise, e.g. which angles, speeds, accelerations, etc. that have to be reproduced or that cannot be exceeded during the reproduction of the physical exercise. For instance, a physical exercise evaluation procedure that may be digitally adjusted is that described in commonly owned patent document EP18398006, which is hereby incorporated by reference in its entirety. This procedure determines whether a tracked target is correctly reproducing a movement defined by one or more predetermined constraints, the computing device removes or disregards predetermined constraints defining the movement to be performed, particularly second, third, and/or further predetermined constraints. In this way, the computing device determines whether the movement (as determined from the sensor measurements) of the tracked target is correctly reproduced based on a less demanding movement due to the reduction in predetermined constraints that have to be met. When the tracked target is a user, such adjustment of the physical exercise evaluation procedure usually results in fewer erroneous determinations of incorrect reproduction of movement by the user.

In some embodiments, the step of adjusting the operation of the motion tracking system comprises (or further comprises) providing at least one user perceptible signal indicative of the computing device having determined that at least one magnetic field measurement is anomalous.

The computing device or a computing device controlling the motion tracking system commands the provision of a user perceptible signal (e.g. visual indications, audible indications, tactile indications such as a vibration) to a means for providing such user perceptible signal, e.g. a screen of the motion tracking system, loudspeakers of the motion tracking system, vibrators in the sensors themselves, etc. in order to indicate that one or more sensors are affected by magnetic disturbances that may result in an inaccurate motion tracking. The user perceptible signal may even indicate which are the affected sensors so that the same are not used during the motion tracking procedure. To this end, the computing device transmits a signal to the means or a device controlling the means so that the user perceptible signal is provided.

In some embodiments, the step of digitally adjusting the physical exercise evaluation procedure comprises digitally adjusting an algorithm with which the motion tracking system digitally determines whether a user tracked with the plurality of sensors performs a physical exercise. The algorithm is digitally adjusted based on the sensors and the magnetic field measurements thereof for which the computing device has determined that the difference of the intensities and/or the inclinations exceeds the threshold value, and/or that the (x,y) point falls outside of the threshold area (for example, if it has determined that the difference of intensities exceeds the intensity threshold, and/or the difference of inclinations exceeds the inclination threshold, and/or the weighted sum exceeds the combined threshold).

In some embodiments, the method further comprises measuring, each sensor of the plurality of sensors, a magnetic field, thereby providing the respective magnetic field measurement, while the sensors are introduced in a holding device, the holding device comprising at least one cavity adapted for introduction of one or more sensors of the plurality of sensors, the motion tracking system comprising the holding device.

The holding device may be a device as described in commonly owned patent document EP18398008 that is hereby incorporated by reference in its entirety. The holding device may be used for storing the sensors while the same are not in use, and/or for verifying that each sensor provides a magnetic field measure that does not differ from the magnetic field measure of the other sensors by more than a certain value due to a miscalibration, and/or for calibrating the sensors in a simple and effective manner.

When the verification is under way (before performing a calibration and/or after performing a calibration), the sensors measure the magnetic field so that the computing device may digitally process the magnetic field measurements in order to determine whether magnetic disturbances are affecting the measurements.

In some embodiments, the method further comprises measuring, each sensor of the plurality of sensors, a magnetic field, thereby providing the respective magnetic field measurement, while the sensors are provided on a target tracked with the plurality of sensors.

While the motion of a target is being tracked with the plurality of sensors, that is to say while the sensors are placed on the target, the sensors measure the magnetic field for tracking the motion but also for digitally processing the magnetic field measurements in order to determine the existence of magnetic disturbances. Accordingly, the method makes possible to determine the existence of such disturbances and adjust the operation of the motion tracking system while the motion of the target is being tracked.

A second aspect of the invention relates to a motion tracking system comprising:
   a computing device comprising at least one processor and at least one memory; and
   a plurality of sensors, each sensor comprising a magnetometer, a gyroscope and an accelerometer, and each sensor being configured to provide a magnetic field measurement;

the at least one processor is configured, together with the at least one memory, to digitally process the magnetic field measurement of each sensor of the plurality of sensors in order to determine if a difference of intensities and/or inclinations of at least one pair of magnetic field measurements exceeds a threshold value, and/or if an (x,y) point with the differences of intensities and inclinations as coordinates thereof falls outside of a threshold area; and the at least one processor is further configured, together with the at least one memory, to adjust operation of the motion tracking system if at least one difference exceeds the threshold value and/or the (x,y) point falls outside of the threshold area.

The motion tracking system tracks a target, such as a person or an object, upon placing the sensors thereon (when the sensors are placed on a person, usually each sensor is placed on a different body member). The motion tracking relies on the measurements of the sensors, including the magnetic field sensed by the magnetometer of each sensor, therefore when the computing device digitally processes the magnetic field measurements and determines that there is a magnetic disturbance affecting the measured magnetic field, it adjusts the operation of the motion tracking system based on the magnetic disturbance.

Also, the measurements of both the gyroscope and the accelerometer of each sensor make possible to perform the determination concerning the magnetic disturbance irrespective of the orientation of the sensors on the target. In this sense, when e.g. a person has the sensors placed thereon, the orientation of the sensors varies in accordance with the posture and/or movement of the different body members of the person, and the computing device determines the orientation of the sensors as known in the art based on the measurements of the gyroscope and the accelerometer (and, optionally, further based on the measurements of the magnetometer), thereby being capable of determining whether there is a magnetic disturbance irrespective of the posture and/or movement(s) performed by the person.

In some embodiments, the at least one processor digitally processes the magnetic field measurement of each sensor of the plurality of sensors for determining, for each pair of magnetic field measurements:

whether a difference of intensities of the magnetic field measurements exceeds an intensity threshold;
whether a difference of inclinations of the magnetic field measurements exceeds an inclination threshold; and
whether a weighted sum of the difference of intensities and the difference of inclinations exceeds a combined threshold;
and the at least one processor adjusts the operation of the motion tracking system if at least one of the differences of intensities exceeds the intensity threshold, and/or at least one of the differences of inclinations exceeds the inclination threshold, and/or at least one of the weighted sums exceeds the combined threshold.

In some embodiments, the at least one processor is further configured, together with the at least one memory, to digitally select one magnetic field measurement from each plurality of magnetic field measurements provided by the sensors such that a time difference between each pair of selected magnetic field measurements is as short as possible.

In some embodiments, the at least one processor is further configured, together with the at least one memory, to decompose each magnetic field measurement provided by the sensors into intensity and inclination of the measured magnetic field.

In some embodiments, each sensor of the plurality of sensors is configured to provide the magnetic field measurement decomposed into intensity and inclination of the measured magnetic field.

In some embodiments, the at least one processor is configured, together with the at least one memory, to adjust the operation of the motion tracking system by (or further by) not processing the magnetic field measurements in a sensor fusion algorithm of respective sensors, the respective sensors being those for which the at least one processor has determined that the difference of the intensities and/or the inclinations exceeds the threshold value, and/or that the (x,y) point falls outside of the threshold area (for example, it has determined that the difference of intensities exceeds the intensity threshold, and/or the difference of inclinations exceeds the inclination threshold, and/or the weighted sum exceeds the combined threshold).

In some embodiments, the at least one processor is configured, together with the at least one memory, to adjust the operation of the motion tracking system by (or further by) digitally adjusting one of a motion tracking procedure or a physical exercise evaluation procedure, the motion tracking procedure or the physical exercise evaluation procedure being run in the at least one processor. The motion tracking procedure or the physical exercise evaluation procedure is digitally adjusted based on the sensors and the magnetic field measurements thereof for which the computing device has determined that the difference of the intensities and/or the inclinations exceeds the threshold value, and/or that the (x,y) point falls outside of the threshold area (for example, it has determined that the difference of intensities exceeds the intensity threshold, and/or the difference of inclinations exceeds the inclination threshold, and/or the weighted sum exceeds the combined threshold).

In some embodiments, the at least one processor is configured, together with the at least one memory, to adjust the operation of the motion tracking system by (or further by) providing at least one user perceptible signal indicative of the at least one processor having determined that at least one magnetic field measurement is anomalous, the motion tracking system comprising at least one means for providing the at least one user perceptible signal.

In some embodiments, the at least one processor digitally adjusts the physical exercise evaluation procedure by digitally adjusting an algorithm with which the motion tracking system digitally determines whether a user tracked with the plurality of sensors performs a physical exercise. The algorithm is digitally adjusted based on the sensors and the magnetic field measurements thereof for which the computing device has determined that the difference of the intensities and/or the inclinations exceeds the threshold value, and/or that the (x,y) point falls outside of the threshold area (for example, has determined that the difference of intensities exceeds the intensity threshold, and/or the difference of inclinations exceeds the inclination threshold, and/or the weighted sum exceeds the combined threshold).

In some embodiments, the motion tracking system further comprises a holding device, the holding device comprising at least one cavity adapted for introduction of one or more sensors of the plurality of sensors; each sensor of the plurality of sensors is configured (or further configured) to measure a magnetic field, thereby providing the respective magnetic field measurement, while the sensor is introduced in the holding device.

In some embodiments, each sensor of the plurality of sensors is configured (or further configured) to measure a magnetic field, thereby providing the respective magnetic field measurement, while the sensor is provided on a target tracked with the plurality of sensors.

Similar advantages as those described with respect to the first aspect of the invention are also applicable to this aspect of the invention.

A third aspect of the invention relates to a computer program product that has instructions which, when executed by a computing device, cause the computing device to perform the steps of a method according to the first aspect of the invention.

A fourth aspect of the invention relates to a data stream which is representative of a computer program product according to the third aspect of the invention.

A fifth aspect of the invention relates to a computer-readable storage medium having stored therein a computer program product according to the third aspect of the invention.

Similar advantages as those described with respect to the first aspect of the invention are also applicable to the third, fourth and fifth aspects of the invention.

BRIEF DESCRIPTION OF THE DRAWINGS

To complete the description and in order to provide for a better understanding of the invention, a set of drawings is provided. Said drawings form an integral part of the description and illustrate embodiments of the invention, which should not be interpreted as restricting the scope of the invention, but just as examples of how the invention can be carried out. The drawings comprise the following figures.

DESCRIPTION OF WAYS OF CARRYING OUT THE INVENTION

Figure 1:
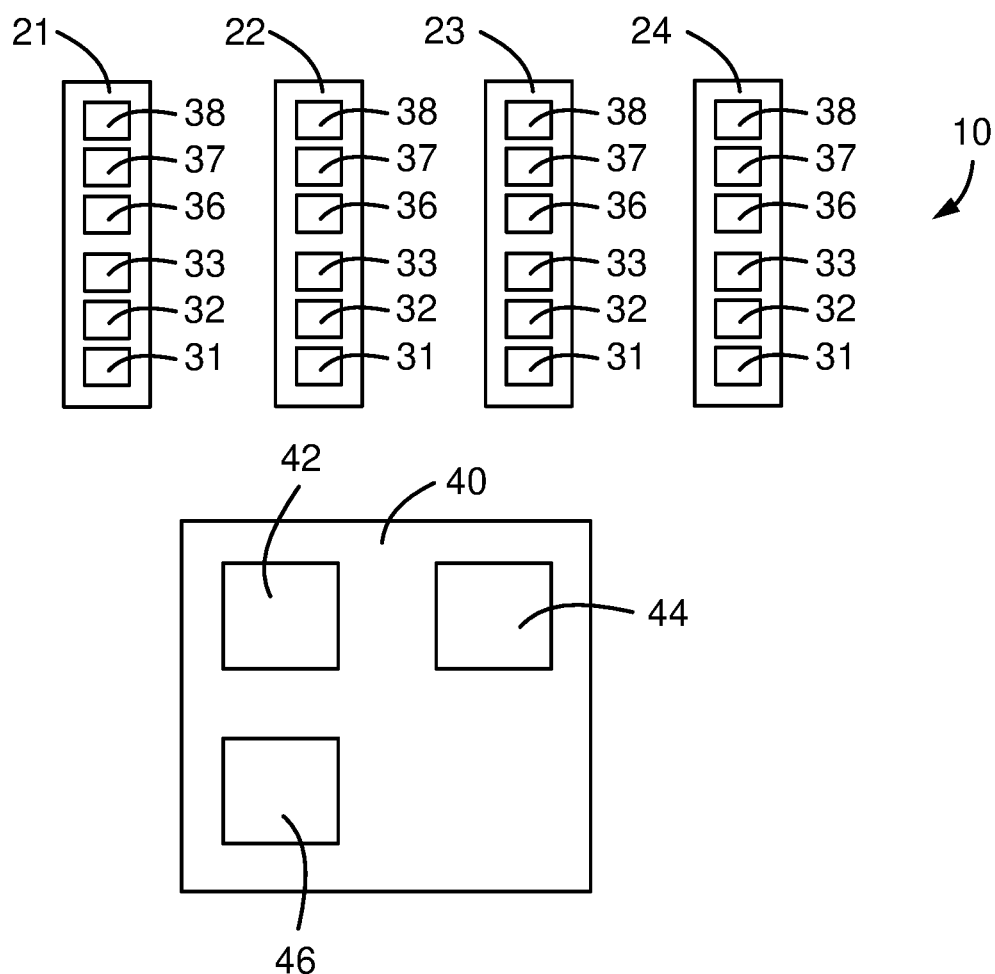
FIG. 1 diagrammatically shows a motion tracking system in accordance with an embodiment.

FIG. 1 diagrammatically shows a motion tracking system 10 in accordance with an embodiment. The motion tracking system 10 includes a plurality of sensors 21-24 and a computing device 40.

The sensors 21-24 are MARG sensors that include a magnetometer 31, a gyroscope 32 and an accelerometer 33. The sensors 21-24 also include at least one processor 36 and at least one memory 37 for running a sensor fusion algorithm. In preferred embodiments such as the one of FIG. 1, the sensors 21-24 further include a first communications module 38 for transmitting and receiving data that enables the sensors 21-24 to transmit (through a wired or wireless communications technology and protocol known by a skilled person, for instance but without limitation, Bluetooth communications, cellular network communications such as GSM, UMTS or LTE, wireless LAN communications, etc.) measurements of each of the sensing devices 31-33 and/or measurements as provided by the sensor fusion algorithm to the computing device 40. The same first communications modules 38 enable the sensors 21-24 to receive data from the computing device 40. In less preferred embodiments, the sensors 21-24 are not provided with the first communications module 38; in these embodiments, data can be extracted from the sensors 21-24 and/or provided to the sensors 21-24 by means of a computer readable storage medium.

The sensors 21-24 may be adapted for arrangement on the target with attaching means that the sensors 21-24 comprise or be held on the target (e.g. a person) whose motion is to be tracked with attaching means that the target comprise. The attaching means may be e.g. straps, mechanical clips, Velcro, etc.

The computing device 40 includes at least one processor 42 and at least one memory 44. Preferably, the computing device 40 further includes a second communications module 46 for transmitting and receiving data. When the computing device 40 is not provided with the second communications module 46, data can be extracted therefrom and/or introduced therein by means of a computer readable storage medium.

Figure 2:
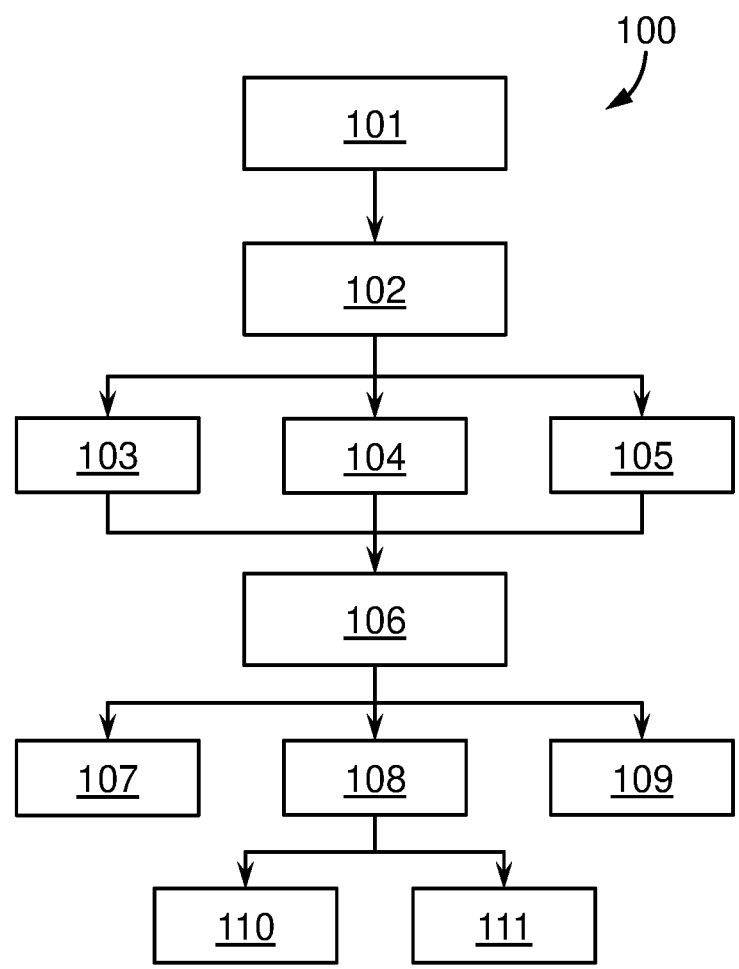
FIG. 2 diagrammatically shows a method in accordance with an embodiment.

FIG. 2 diagrammatically shows a method 100 in accordance with an embodiment.

The method 100 comprises a step of receiving 101, a computing device (for example the computing device 40 of FIG. 1) of a motion tracking system (for example the motion tracking system 10 of FIG. 1), a magnetic field measurement from each sensor of a plurality of sensors (for example the sensors 21-24 of FIG. 1) of the motion tracking system. Each sensor measures the magnetic field, preferably a number of times, so as to provide the magnetic field measurements to the computing device. Preferably, the sensors measure the magnetic field while the same are introduced in a holding device (for example the holding device 50, which is described below with reference to FIGS. 3A-3B) of the motion tracking system, and/or while the sensors are provided on a target tracked with the sensors.

When carrying out the method 100, the magnetic field measurements received 101 in the computing device are the raw measurements (in some cases decomposed into intensity and inclination of the measured magnetic fields) of the magnetometer in the sensors so that the computing device may determine if there are magnetic disturbances affecting the measurements, whereas for the motion tracking itself preferably the measurements outputted by the sensor fusion algorithm are provided to the computing device.

The method 100 further comprises a step of digitally processing 102 each of the magnetic field measurements. The digital processing is carried out by the computing device so as to determine if one or more sensors have sensed a magnetic field with a magnetic disturbance, and this is done by processing 102 the magnetic field measurements for each pair of sensors of the motion tracking system.

The computing device, by means of at least one processor and at least one memory thereof, digitally computes a difference between the intensity of the magnetic field measurement of one sensor (i.e. first sensor) and the intensity of the magnetic field measurement of another sensor (i.e. second sensor), and it also computes a difference (i.e. an angle) between the inclination of the magnetic field measurement of the first sensor and the inclination of the magnetic field measurement of the second sensor. The computing device then establishes whether the difference of the intensities and/or the inclinations (either taken alone, i.e. difference of intensities or difference of inclinations, or combined in an equation) exceeds a threshold value, and/or the (x,y) point having the difference of intensities or inclinations as X coordinate and the other one of the difference of intensities or inclinations as Y coordinate falls outside of a threshold area. The same digital processing 102 is carried out with the magnetic field measurements of the remaining sensors of the motion tracking system.

In some embodiments, such as the embodiment of FIG. 2, the computing device determines if any difference of intensities exceeds 103 an intensity threshold, and also determines if any difference of inclinations exceeds 104 an inclination threshold; furthermore, the computing device also computes, for the magnetic field measurements for each pair of sensors of the motion tracking system, a weighted sum of the difference of intensities and the difference of inclinations and establishes whether it exceeds 105 a combined threshold. The weighted sum can be expressed with the following formula: W1 diff_intensities+ W2*diff_inclinations, where W1 and W2 are weighting factors, diff_intensities is the difference between the intensity of the magnetic field measurement of the first and the intensity of the magnetic field measurement of the second sensors, and diff_inclinations is the difference between the inclination of the magnetic field measurement of the first sensor and the inclination of the magnetic field measurement of the second sensor.

Even if at one point the computing device determines that a difference of intensity, or a difference of inclination, or a weighted sum exceeds 103-105 the respective threshold, the computing device further digitally processes the remaining pairs of magnetic field measurements in order to determine which specific sensor or sensors is or are affected by the magnetic disturbances (one of the two sensors whereby it is determined that there are magnetic disturbances may not be affected significantly by the magnetic disturbances), and/or in order to determine which other sensors also provide disturbed magnetic field measurements. Depending on the number of sensors affected by the magnetic disturbances and/or where the same are to be placed on the target, the operation of the motion tracking system is adjusted 106 in one way or another during the following step of the method 100.

By way of example, if the motion tracking system has four sensors, the computing device computes the differences between the magnetic field measurement (the intensity and the inclination thereof) of the first sensor and the magnetic field measurement (the intensity and the inclination thereof) of each of the second, third, and fourth sensors, makes the weighted sum thereof, and compares each resulting value with the respective threshold, computes the differences between the magnetic field measurement (the intensity and the inclination thereof) of the second sensor and the magnetic field measurement (the intensity and the inclination thereof) of each of the first, third and fourth sensors, makes the weighted sum thereof, and compares each resulting value with the respective threshold, and so on. In those embodiments in which the intensity and the inclination of the magnetic field measurements are filtered, e.g. with a low-pass filter, the aforementioned computations of differences and weighted sums are made with the filtered intensities and inclinations. Preferably, the time difference with which the sensors made the measurements is as small as possible.

The method further comprises the step of adjusting the operation of the motion tracking system if any one of the differences computed exceeds a threshold value, and/or the (x,y) point falls outside of a threshold area. In the embodiment of FIG. 2, the operation of the motion tracking system is adjusted if at least one of the differences of intensities exceeds 103 the intensity threshold, and/or at least one of the differences of inclinations exceeds 104 the inclination threshold, and/or at least one weighted sum exceeds 105 the combined threshold.

The method 100 may be repeated a number of times so as to dynamically adjust 106 the operation of the motion tracking system based on a more recent state of the sensors and the magnetic fields sensed. For instance, the method 100 may be repeated every time all the sensors make a new measurement, or every time all the sensors have made e.g. ten, twenty, a hundred, a thousand, etc. new measurements, so that the computing device is not continuously using processing power for determining the existence of magnetic disturbances. In fact, the magnetic disturbances are usually not instantaneous (i.e. they do not appear at one time instant and disappear shortly thereafter), therefore the repetition of the method 100 may be staggered, and the frequency with which it is repeated may be selected based on the requirements of the motion tracking application and the environment where the motion tracking is conducted; the latter is important as well since magnetic disturbances depend on the environment, the devices therein and the operation of said devices.

The operation of the motion tracking system may be adjusted 106 in at least one of the following ways:

By not processing 107 the magnetic field measurements in a sensor fusion algorithm of the respective sensors of the motion tracking system. The sensors (those for which the computing device has determined that the difference of the intensities and/or the inclinations exceeds the threshold value, and/or the (x,y) point falls outside of the threshold area) are commanded not to process, in the sensor fusion algorithm, magnetic field measurements until commanded otherwise. Since it is not known which measurements are affected by the magnetic disturbances, from the moment they are commanded not to process the measurements they disregard all further measurements until the computing device determines that each of the difference of intensities, the difference of inclinations and the weighted sum corresponding to later measurements does not exceed 103-105 respective thresholds;

By digitally adjusting 108 one of a motion tracking procedure 110 or a physical exercise evaluation procedure 111;

By providing 109 at least one user perceptible signal indicative of the computing device having determined that at least one magnetic field measurement is anomalous.

The physical exercise evaluation procedure 111 to be adjusted 108 is, for example but not limited to, the evaluation procedure of patent document EP18398006, which is a method for determining a correct reproduction of a movement of a target based on a plurality of orientations thereof at different time instants, the different time instants at least including first and second time instants, the second time instant being posterior to the first time instant, the movement being defined by at least a first predetermined constraint, the first predetermined constraint being defined for first and second orientations of the plurality of orientations and defined by a start angle, an end angle and a first plane definition. In the physical exercise evaluation procedure 111 first and second planes are provided, each defined by the first plane definition, corresponding to the first and second time instants, respectively; a first pair of vectors is provided by projecting the first orientation and the second orientation, corresponding to the first time instant, onto the first plane; a second pair of vectors is provided by projecting the first orientation and the second orientation, corresponding to the second time instant, onto the second plane; first and second angles between the pair of vectors of the first and second pairs of vectors, respectively, are computed; and the correct reproduction of the movement is determined if the first angle is equal to or less than the start angle, and the second angle is equal to or greater than the end angle. The movement is sometimes defined by further predetermined constraints (e.g. second, third, fourth or more predetermined constraints), each defined for two orientations and defined by a start angle, an end angle, and a plane definition, and in order to determine the correct reproduction of the movement the different predetermined constraints shall be met by the tracked target. The adjustment 108 of the physical exercise evaluation procedure 111 entails disregarding or removing one, some or all of these further predetermined constraints from the procedure so as to reduce the number of predetermined constraints to be met for determining the correct reproduction of the movement.

Figure 3A:
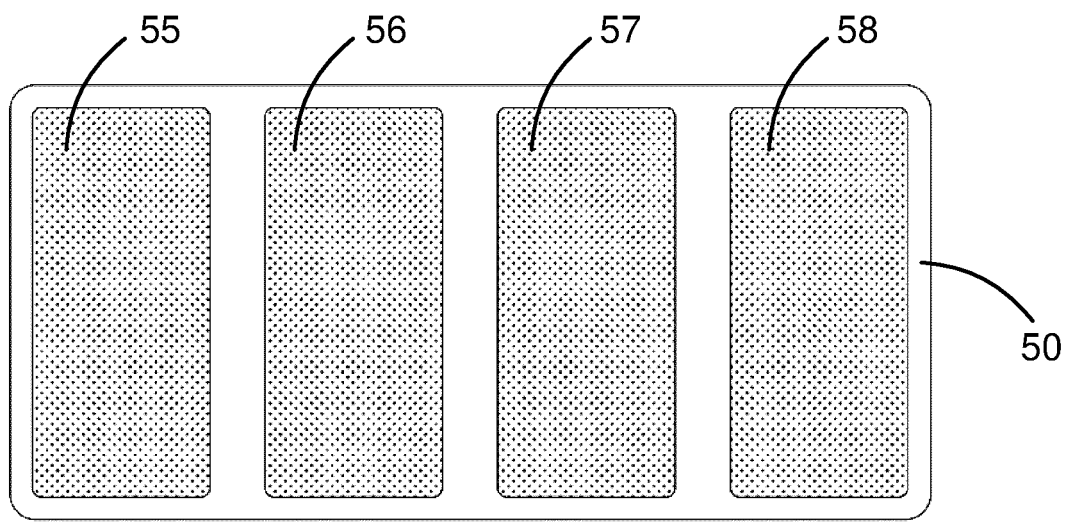
FIGS. 3A-3B show a holding device of a motion tracking system in accordance with an embodiment.
Figure 3B:
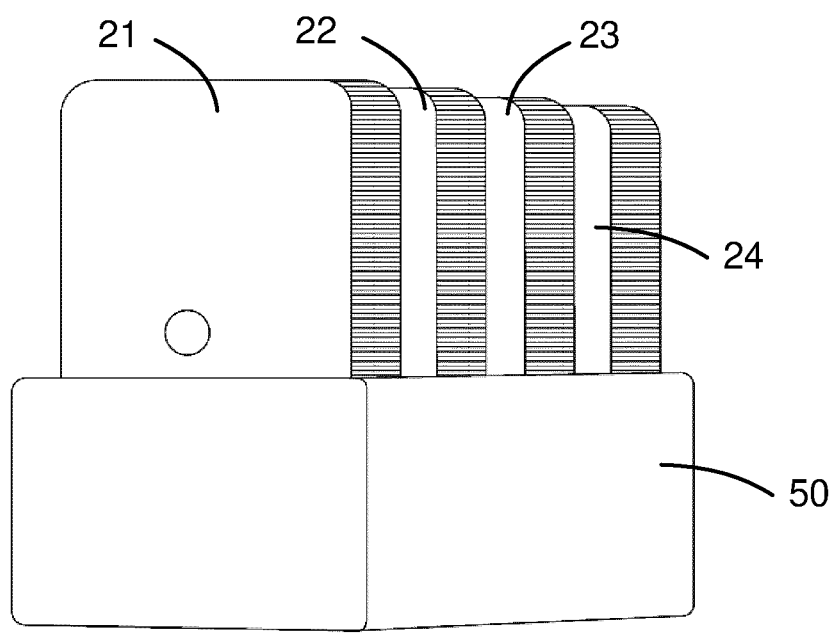

FIGS. 3A-3B show a holding device 50 of a motion tracking system in accordance with an embodiment.

The holding device 50, which may be part of a motion tracking system such as the motion tracking system 10 of FIG. 1, comprises a plurality of cavities 55-58 adapted to receive the sensors 21-24 as illustrated in FIG. 3B.

In this example, the cavities 55-58 are dimensioned such that the sensors 21-24 may be introduced with a particular orientation thereof. The sensors 21-24 may fit tightly or with some play. The holding device 50 may be used for one or more of the following purposes: for storing the sensors 21-24 while the same are not in use, for determining whether the sensors 21-24 require to be calibrated, and/or even for calibrating the sensors 21-24 in a simple and effective manner, in which case the holding device 50 is rotated for calibrating the sensors 21-24 while they are introduced therein (depending on the type of rotation necessary for calibrating the sensors, it may be necessary to cover the sensors 21-24 with the hand during the calibration procedure so that they do not fall off from the holding device 50).

In some other examples, the holding device 50 comprises a single cavity or more than one cavity in which two or more sensors may be introduced side-by-side such that the two or more sensors have fixed relative orientations (so that each sensor does not change its orientation with respect to the other sensors). To this end, the cavity or cavities may include one or more spacing elements that provide a gap between each pair of sensors.

While the sensors 21-24 are introduced in the holding device 50, they may provide the magnetic field measurements so that a computing device may determine if there are magnetic disturbances in said measurements, for instance as described with reference to the method 100 of FIG. 2.

Figure 4:
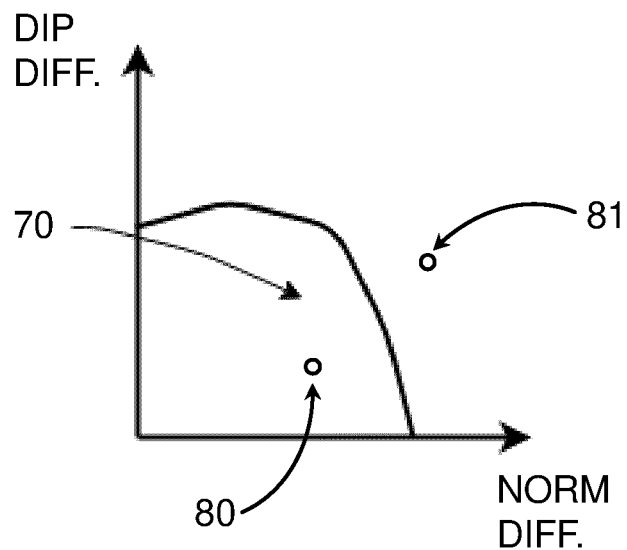
FIGS. 4-5 show graphs with threshold values and threshold areas.

FIG. 4 shows a graph with a threshold area 70.

The threshold area 70 is defined by a curve and the X and Y axes, the latter corresponding to the norm or intensity difference, and the dip or inclination difference, respectively. It is readily apparent that the X and Y axes could be interchanged.

Also in the graph are shown first and second (x,y) points 80, 81 (illustrated with circles). The first (x,y) point 80 has a first difference of intensities as X coordinate and a first difference of inclinations as Y coordinate, both first differences being computed for a first pair of magnetic field measurements. The second (x,y) point 81 has a second difference of intensities as X coordinate and a second difference of inclinations as Y coordinate, both second differences being computed for a second pair of magnetic field measurements. The first (x,y) point 80 falls within the threshold area 70, thus it is determined that no magnetic disturbance has affected the magnetic field measurements of the first pair, whereas the second (x,y) point 81 falls outside of the threshold area 70, hence it is determined that a magnetic disturbance has affected the at least one magnetic field measurement of the second pair.

Figure 5:
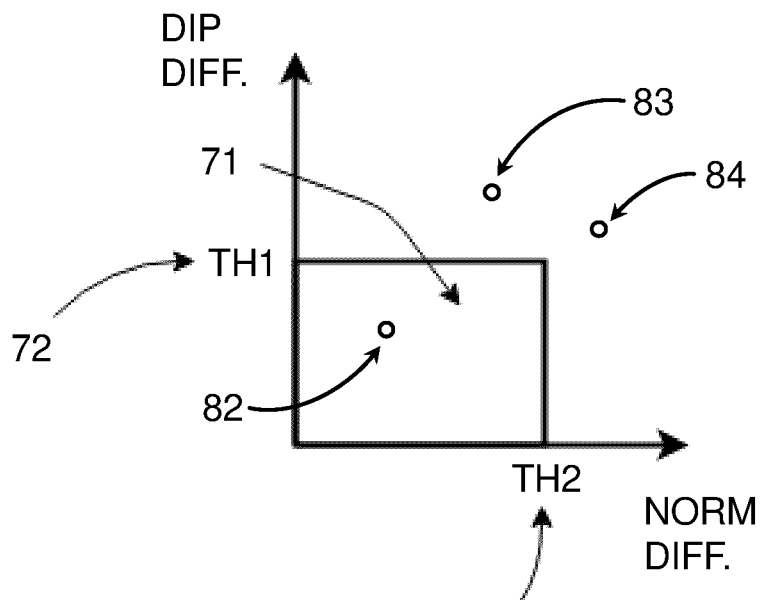

FIG. 5 shows a graph with a threshold area 71, and first and second threshold values 72, 73.

The threshold area 71 is defined by the first and second threshold values (TH1, TH2) 72, 73, thereby resulting in a rectangular area. As in the graph of FIG. 4, the X axis of the graph corresponds to the to the norm or intensity difference, and the Y axis of the graph corresponds to the dip or inclination difference, even though they could be interchanged.

Also in the graph are shown first, second and third (x,y) points 82-84 (illustrated with circles). Each of the first, second and third (x,y) points 82-84 has a difference of intensities as X coordinate and a difference of inclinations as Y coordinate, both differences being computed for first, second and third pair of magnetic field measurements, respectively. The first (x,y) point 82 falls within the threshold area 71, which also means that the difference of intensities thereof does not exceed the intensity threshold (TH2) 73 and the difference of inclinations thereof does not exceed the inclination threshold (TH1) 72. Each of the second and third (x,y) points 83, 84 fall outside of the threshold area 71. In particular, the difference of intensities of the second (x,y) point 83 does not exceed the intensity threshold (TH2) 73 but the difference of inclinations thereof exceeds the inclination threshold (TH1) 72; the difference of intensities and the difference of inclinations of the third (x,y) point 84 both exceed the respective thresholds (TH1, TH2) 72, 73.

In this text, the term "comprises" and its derivations (such as "comprising", etc.) should not be understood in an excluding sense, that is, these terms should not be interpreted as excluding the possibility that what is described and defined may include further elements, steps, etc.

On the other hand, the invention is obviously not limited to the specific embodiment(s) described herein, but also encompasses any variations that may be considered by any person skilled in the art (for example, as regards the choice of materials, dimensions, components, configuration, etc.), within the general scope of the invention as defined in the claims.

The invention claimed is:

1. A method for adjusting operation of a motion tracking system for tracking motion of a person and comprising a computing device and a plurality of sensors, each sensor comprising a magnetometer, a gyroscope and an accelerometer, the method comprising:

receiving, by the computing device, a magnetic field measurement from each sensor of the plurality of sensors to obtain at least one pair of magnetic field measurements;

digitally processing, by the computing device, each of the magnetic field measurements in order to determine, for each pair of magnetic field measurements:

whether a difference of intensities of the magnetic field measurements exceeds an intensity threshold, whether a difference of inclinations of the magnetic field measurements exceeds an inclination threshold, and whether a weighted sum of the difference of intensities and the difference of inclinations exceeds a combined threshold; and adjusting the operation of the motion tracking system if at least one of: at least one of the differences of intensities exceeds the intensity threshold, at least one of the differences of inclinations exceeds the inclination threshold, or at least one of the weighted sums exceeds the combined threshold.

2. The method of claim 1, wherein the adjusting of the operation of the motion tracking system comprises at least one of:
not processing the magnetic field measurements in a sensor fusion algorithm of respective sensors, the respective sensors being those for which the computing device has determined that at least one of: at least one of the differences of intensities exceeds the intensity threshold, at least one of the differences of inclinations exceeds the inclination threshold, or at least one of the weighted sums exceeds the combined threshold;
digitally adjusting one of a motion tracking procedure or a physical exercise evaluation procedure; or
providing at least one user perceptible signal indicative of the computing device having determined that at least one magnetic field measurement is anomalous.

3. The method of claim 2, wherein the adjusting of the operation of the motion tracking system at least comprises digitally adjusting the physical exercise evaluation procedure; and wherein digitally adjusting the physical exercise evaluation procedure comprises digitally adjusting an algorithm with which the motion tracking system digitally determines whether a user tracked with the plurality of sensors performs a physical exercise.

4. The method of claim 1, wherein the receiving of the magnetic field measurement from each sensor of the plurality of sensors comprises:
receiving, by the computing device, a plurality of magnetic field measurements from each sensor of the plurality of sensors; and
digitally selecting, by the computing device, one magnetic field measurement from each plurality of magnetic field measurements provided by the sensors such that a time difference between each pair of selected magnetic field measurements is as short as possible.

5. The method of claim 1, further comprising measuring, by each sensor of the plurality of sensors, a magnetic field, thereby providing the respective magnetic field measurement, while the sensors are at least one of:
provided on a target tracked with the plurality of sensors, or
introduced in a holding device.

6. The method of claim 5, comprising measuring, by each sensor of the plurality of sensors, the magnetic field while the sensors are introduced in the holding device, the holding device comprising at least one cavity adapted for introduction of one or more sensors of the plurality of sensors.

7. The method of claim 1, wherein:
each sensor of the plurality of sensors provides the magnetic field measurements decomposed into intensity and inclination of the measured magnetic field; or
the computing device decomposes each magnetic field measurement into intensity and inclination of the measured magnetic field.

8. A motion tracking system for tracking motion of a person, comprising:
a computing device comprising at least one processor and at least one memory; and
a plurality of sensors, each sensor comprising a magnetometer, a gyroscope and an accelerometer, and each sensor being configured to provide a magnetic field measurement;
wherein the at least one processor is configured, together with the at least one memory, to digitally process the magnetic field measurement of each sensor of the plurality of sensors, including at least one pair of magnetic field measurements, in order to determine, for each pair of magnetic field measurements:
whether a difference of intensities of the magnetic field measurements exceeds an intensity threshold,
whether a difference of inclinations of the magnetic field measurements exceeds an inclination threshold, and
whether a weighted sum of the difference of intensities and the difference of inclinations exceeds a combined threshold; and
wherein the at least one processor is further configured, together with the at least one memory, to adjust operation of the motion tracking system if at least one of: at least one of the differences of intensities exceeds the intensity threshold, at least one of the differences of inclinations exceeds the inclination threshold, or at least one of the weighted sums exceeds the combined threshold.

9. The motion tracking system of claim 8, wherein the at least one processor is configured, together with the at least one memory, to adjust the operation of the motion tracking system by at least one of:
not processing the magnetic field measurements in a sensor fusion algorithm of respective sensors, the respective sensors being those for which the at least one processor has determined that at least one of: at least one of the differences of intensities exceeds the intensity threshold, at least one of the differences of inclinations exceeds the inclination threshold, or at least one of the weighted sums exceeds the combined threshold;
digitally adjusting one of a motion tracking procedure or a physical exercise evaluation procedure; or
providing at least one user perceptible signal indicative of the at least one processor having determined that at least one magnetic field measurement is anomalous.

10. The motion tracking system of claim 9, wherein the at least one processor adjusts the operation of the motion tracking system at least by digitally adjusting the physical exercise evaluation procedure, and wherein digitally adjusting the physical exercise evaluation procedure comprises digitally adjusting an algorithm with which the motion tracking system digitally determines whether a user tracked with the plurality of sensors performs a physical exercise.

11. The motion tracking system of claim 8, wherein the at least one processor is further configured, together with the at least one memory, to digitally select one magnetic field measurement from each plurality of magnetic field measurements provided by the sensors such that a time difference between each pair of selected magnetic field measurements is as short as possible.

12. The motion tracking system of claim 8, wherein at least one of:
each sensor of the plurality of sensors is configured to measure a magnetic field, thereby providing the respective magnetic field measurement, while the sensor is provided on a target tracked with the plurality of sensors; or
the motion tracking system further comprises a holding device for introduction of one or more sensors of the plurality of sensors, and each sensor of the plurality of sensors is configured to measure a magnetic field, thereby providing the respective magnetic field measurement, while the sensor is introduced in the holding device.

13. The motion tracking system of claim 12, wherein the holding device comprises at least one cavity for introduction of the one or more sensors of the plurality of sensors.

14. The motion tracking system of claim 8, wherein:
the at least one processor is further configured, together with the at least one memory, to decompose each magnetic field measurement provided by the sensors into intensity and inclination of the measured magnetic field; or
each sensor of the plurality of sensors is configured to provide the magnetic field measurement decomposed into intensity and inclination of the measured magnetic field.

15. A non-transitory computer-readable storage medium having stored therein a computer program product that, when executed by a computing device, cause the computing device to perform:
receiving a magnetic field measurement from each sensor of a plurality of sensors of a motion tracking system for tracking motion of a person to obtain at least one pair of magnetic field measurements;
digitally processing each of the magnetic field measurements in order to determine, for each pair of magnetic field measurements:
whether a difference of intensities of the magnetic field measurements exceeds an intensity threshold,
whether a difference of inclinations of the magnetic field measurements exceeds an inclination threshold, and
whether a weighted sum of the difference of intensities and the difference of inclinations exceeds a combined threshold; and
adjusting operation of the motion tracking system if at least one of: at least one of the differences of intensities exceeds the intensity threshold, at least one of the differences of inclinations exceeds the inclination threshold, or at least one of the weighted sums exceeds the combined threshold.

16. The non-transitory computer-readable storage medium of claim 15, wherein adjusting the operation of the motion tracking system comprises at least one of:
not processing the magnetic field measurements in a sensor fusion algorithm of respective sensors, the respective sensors being those for which the computing device has determined that at least one of: at least one of the differences of intensities exceeds the intensity threshold, at least one of the differences of inclinations exceeds the inclination threshold, or at least one of the weighted sums exceeds the combined threshold;
digitally adjusting one of a motion tracking procedure or a physical exercise evaluation procedure; or
providing at least one user perceptible signal indicative of the computing device having determined that at least one magnetic field measurement is anomalous.

17. The non-transitory computer-readable storage medium of claim 16, wherein digitally adjusting the physical exercise evaluation procedure comprises digitally adjusting an algorithm with which the motion tracking system digitally determines whether a user tracked with the plurality of sensors performs a physical exercise.

18. The non-transitory computer-readable storage medium of claim 15, wherein receiving the magnetic field measurement from each sensor of the plurality of sensors comprises:
receiving a plurality of magnetic field measurements from each sensor of the plurality of sensors; and
digitally selecting one magnetic field measurement from each plurality of magnetic field measurements provided by the sensors such that a time difference between each pair of selected magnetic field measurements is as short as possible.

19. The non-transitory computer-readable storage medium of claim 15, wherein the computer program product further causes the computing device to perform:
receiving, from each sensor of the plurality of sensors, a magnetic field, thereby receiving the respective magnetic field measurement, while the sensors are at least one of:
provided on a target tracked with the plurality of sensors; or
introduced in a holding device.

20. The non-transitory computer-readable storage medium of claim 19, wherein the computing device is caused to receive, from each sensor of the plurality of sensors, the magnetic field while the sensors are introduced in the holding device, the holding device comprising at least one cavity adapted for introduction of one or more sensors of the plurality of sensors.

* * * * *